(12) United States Patent
Goltman

(10) Patent No.: US 6,421,276 B1
(45) Date of Patent: Jul. 16, 2002

(54) METHOD AND APPARATUS FOR CONTROLLING ERASE OPERATIONS OF A NON-VOLATILE MEMORY SYSTEM

(75) Inventor: Gennady Goltman, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/927,277

(22) Filed: Aug. 9, 2001

(51) Int. Cl.$^7$ ................................................ G11C 16/06
(52) U.S. Cl. .......................... 365/185.22; 365/185.29; 365/185.33
(58) Field of Search ...................... 365/185.22, 185.29, 365/185.33

(56) References Cited

U.S. PATENT DOCUMENTS

| | | | |
|---|---|---|---|
| 5,995,418 A | * 11/1999 | Chen et al. | 365/185.29 |
| 6,069,827 A | * 5/2000 | Sinclair | 365/185.29 |
| 6,081,456 A | 6/2000 | Dadashev | 365/185.23 |
| 6,166,959 A | * 12/2000 | Gupta et al. | 365/185.33 |
| 6,327,639 B1 | * 12/2001 | Asnaashari | 365/185.33 |

* cited by examiner

*Primary Examiner*—Trong Phan
(74) *Attorney, Agent, or Firm*—Bever, Hoffman & Harms, LLP; E. Eric Hoffman

(57) ABSTRACT

A non-volatile memory system having an array of 2-bit cells is provided, wherein each cell stores an odd bit and an even bit. An ERASE pulse is applied to either the odd bits or the even bits in response to an ODD_EVEN control signal, which toggles in response to an ERASE pulse. A first ERASE pulse is applied to the odd bits. An erase verify operation is then performed until failing. The erase verify operation will likely fail on an even bit, which has not yet received an ERASE pulse. After the erase verify operation fails, a second ERASE pulse is applied to the even bits in response to the toggled ODD_EVEN control signal. The erase verify operation then resumes until this operation fails, or is successfully completed. This process continues until the erase verify operation is successful. A similar method enables a plurality of NVM blocks to be erased.

22 Claims, 6 Drawing Sheets

METHOD AND APPARATUS FOR CONTROLLING ERASE OPERATIONS OF A NON-VOLATILE MEMORY SYSTEM

FIELD OF THE INVENTION

The present invention relates to the operation of a non-volatile memory system. More specifically, the present invention relates to an improved method and apparatus for enabling a system user to control erase operations in a non-volatile memory system.

BACKGROUND OF THE INVENTION

Non-volatile memory cells are typically arranged in discrete arrays or blocks. During an erase operation, all of the non-volatile memory cells in a block are erased simultaneously. Over-erase conditions may exist in certain memory cells if the erase operation is carried out for too long. In order to prevent over-erase, an erase operation is typically performed with a number of short erase pulses.

FIG. 1 is a flow chart illustrating a conventional erase operation for a block of a non-volatile memory system. The erase operation is initiated in response to an ERASE command. Upon starting the erase operation (Step 101), an initial erase verify address is selected (Step 102). This initial erase verify address typically corresponds with the first address of the block being erased. An erase pulse is applied in parallel to all of the memory cells in the block (Step 103).

After the erase pulse has been applied, all memory cells in the block must be verified as having been erased before the erase operation is concluded (Step 104). The erase verify operation is initialized by an ERASE VERIFY command. The erase verify operation starts at the initial erase verify address and sequentially proceeds to the subsequent addresses in the block until a non-erased memory cell is found, or until the last address of the block is accessed. More specifically, if a non-erased memory cell is detected during the erase verify operation, processing returns to Step 103, and another erase pulse is applied. Erase verification then resumes at Step 104, beginning at address at which the non-erased memory cell was previously detected.

If an erased memory cell is detected during the erase verify operation, then it is determined whether the current erase verify address is equal to the last address in the block. (Step 105). If not, then the current erase verify address is incremented (Step 106), and processing returns to Step 104 for another erase verify operation.

If an erased memory cell is found during the erase verify operation, and the current erase verify address corresponds with the last address of the block, then all of the memory cells have been verified as having been erased. At this time, the erase operation is complete (Step 107).

In some non-volatile memory systems, different portions of the non-volatile memory array are coupled to receive separate erase pulses. Two examples of such systems are described below.

In a first non-volatile memory system, the erase pulse can only be applied to a subset of a non-volatile memory array at any one time, due to power limitations. In this case, the memory array is typically divided into a plurality of equal-sized blocks. Erase operations are then performed separately for each block, with erase pulses being applied in turn to each block.

In a second non-volatile memory system, each of the non-volatile memory cells stores 2-bits of information. As defined herein, each of these 2-bit non-volatile memory cells stores a right (R) bit and a left (L) bit. U.S. Pat. No. 5,768,192 to Eitan describes one such non-volatile memory cell.

FIG. 2 is a schematic diagram illustrating a 3×3 array 200 of 2-bit non-volatile memory cells $M_{0,0}$–$M_{2,2}$, each having a right bit (R) and a left bit (L). In array 200, each column of memory cells has a dedicated pair of bit lines. In array 200 (which is typically much larger than 3×3), an erase operation is performed in two steps. In one step, a first erase pulse is applied to the even bit lines $BL_0$, $BL_2$ and $BL_4$, thereby erasing the right bits (R) of memory cells $M_{0,0}$–$M_{2,2}$. In the other step, a second erase pulse is applied to the odd bit lines $BL_1$, $BL_3$ and $BL_5$, thereby erasing the left bits (L) of memory cells $M_{0,0}$–$M_{2,2}$. The combined duration of the first and second erase pulses is significantly less than the required duration of a single erase pulse that erases all of the even and odd bits in parallel.

FIG. 3 is a schematic diagram illustrating a 3×3 array 300 of 2-bit non-volatile memory cells $M_{0,0}$–$M_{2,2}$, each having a right bit (R) and a left bit (L). In array 300, bit lines are shared by adjacent columns of memory cells. In array 300 (which is typically much larger than 3×3), an erase operation is performed in two steps. In one step, a first erase pulse is applied to the even bit lines $BL_0$ and $BL_2$, thereby erasing the right bits (R) of the memory cells in the first column, the left bits (L) of the memory cells in the second column, and the right bits (R) of the memory cells in the third column. In the other step, a second erase pulse is applied to the odd bit lines $BL_1$ and $BL_3$, thereby erasing the left bits (L) of the memory cells in the first column, the right bits (R) of the memory cells in the second column, and the left bits (L) of the memory cells in the third column. Again, the combined duration of the first and second erase pulses is significantly less than the required duration of a single erase pulse that erases all of the even and odd bits in parallel. Array 300, as well as the circuitry used to access array 300, is described in U.S. Pat. No. 6,081,456 to Dadashev.

In different applications, the erase operation can be controlled externally by the system user or by internal circuitry of the non-volatile memory system. The memory control circuit of a non-volatile memory system is significantly simpler when erase operations are controlled externally by the system user. However, in the above-described arrays, the system user must select which blocks or bit lines receive the various erase pulses. Consequently, the standard erase method illustrated by the flowchart of FIG. 1 cannot be utilized, and new commands must be added to the standard command set. The new commands must enable the selection of even/odd bit lines and/or particular memory blocks to be erased.

It would therefore be desirable to have a method and apparatus for erasing non-volatile memory systems having 2-bit memory transistors and/or multiple blocks, wherein the method and apparatus are compatible with the standard erase operation defined by the flowchart of FIG. 1.

SUMMARY OF THE INVENTION

Accordingly, the present invention provides an interface for automatically selecting the part of the non-volatile memory system to be erased by the next erase pulse. The invention advantageously enables a system user to implement the conventional erase method illustrated by the flowchart of FIG. 1.

In one embodiment, the non-volatile memory system includes an array of 2-bit non-volatile memory cells having a set of odd bit lines and a set of even bit lines. A user command interface is provided to receive an ERASE command from a system user. In response, the user command interface asserts an ERASE signal.

An erase bit pointer is coupled to receive the ERASE signal from the user command interface. The erase bit pointer is configured to generate an ODD_EVEN control signal that toggles between a first state and a second state in response to a predetermined edge of the ERASE signal.

Erase logic is coupled to receive the ERASE signal and the ODD_EVEN control signal. The erase logic is configured to apply an ERASE pulse to the set of odd bit lines when the ODD_EVEN control signal has the first state and the ERASE signal is asserted. The erase logic is further configured to apply an ERASE pulse to the set of even bit lines when the ODD_EVEN control signal has the second state and the ERASE signal is asserted.

After each ERASE pulse has timed out, the system user asserts an ERASE VERIFY command. In response, the user command interface asserts a VERIFY control signal and an erase verify address. These signals are provided to read logic. In response, read logic reads a data value from the erase verify address. The system user determines whether the data value represents a properly erased data value. If so, the system user increments the erase verify address and asserts another ERASE verify command. This process repeats until the system user determines that the data value does not represent a properly erased data value. At this time, the system user asserts another ERASE command.

After the first ERASE command, an ERASE pulse is only applied to half of the bit lines (i.e., either the even bit lines or the odd bit lines). Thus, the first erase verify operation is likely to fail. However, after the second ERASE command, an ERASE pulse has been applied to all of the bit lines in the array. Thus, it is possible for an erase verify operation to succeed after the second ERASE command.

Advantageously, the system user can use the erase method defined by the flowchart of FIG. 1 to implement this embodiment of the present invention.

In another embodiment, the non-volatile memory system includes an array of non-volatile memory cells configured into a plurality of blocks. A user command interface is provided to receive an ERASE command from a system user. In response, the user command interface asserts an ERASE signal.

An erase block pointer is coupled to receive the ERASE signal from the user command interface. The erase block pointer is configured to generate an erase block address that is incremented through the entire address range of the blocks in response to a predetermined edge of the ERASE signal.

Erase logic is coupled to receive the ERASE signal and the erase block address. The erase logic is configured to apply an ERASE pulse to the block identified by the erase block address when the ERASE signal is asserted.

After each ERASE pulse has timed out, the system user asserts an ERASE VERIFY command. In response, the user command interface asserts a VERIFY control signal and an erase verify address. These signals are provided to read logic. In response, read logic reads a data value from the erase verify address. The system user determines whether the data value represents a properly erased data value. If so, the system user increments the erase verify address and asserts another ERASE verify command. This process repeats until the system user determines that the data value does not represent a properly erased data value. At this time, the system user asserts another ERASE command.

After the first ERASE command, an ERASE pulse is only applied to one of the blocks of non-volatile memory cells. Thus, the first erase verify operation is likely to fail. However, after an ERASE pulse has been applied to all of the blocks in the array, it is possible for an erase verify operation to succeed.

Again, the system user can use the erase method defined by the flowchart of FIG. 1 to implement this embodiment of the present invention.

In another embodiment of the present invention, the steps of incrementing the erase verify address and comparing the data value with an erased value can be performed internally, rather than by the system user. In yet another embodiment, the user command interface asserts a RESET signal to initialize the erase bit pointer or the erase block pointer.

The present invention will be more fully understood in view of the following description and drawings.

DETAILED DESCRIPTION OF THE PREFERRED DRAWINGS

Figure 2:
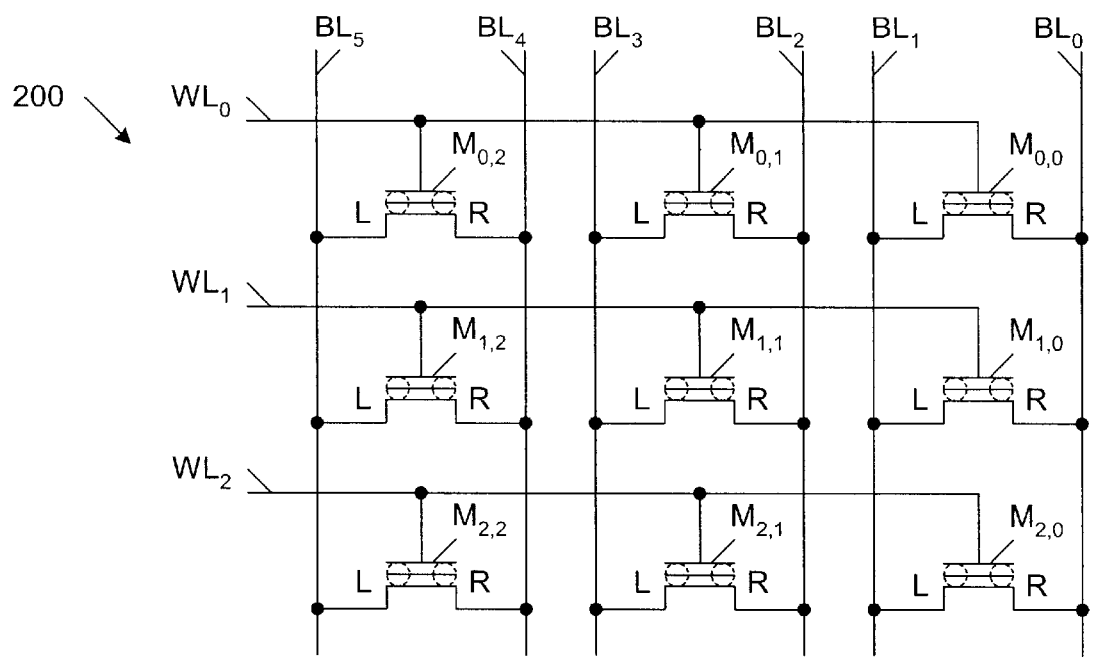
FIGS. 2 and 3 are block diagrams of conventional non-volatile memory systems.
Figure 3:
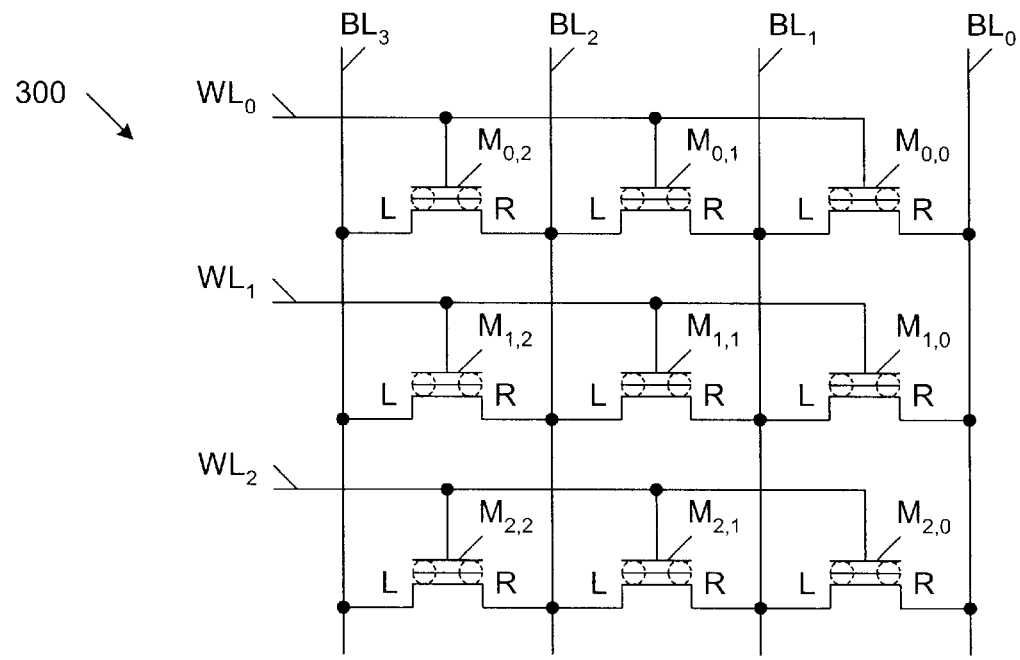
Figure 4:
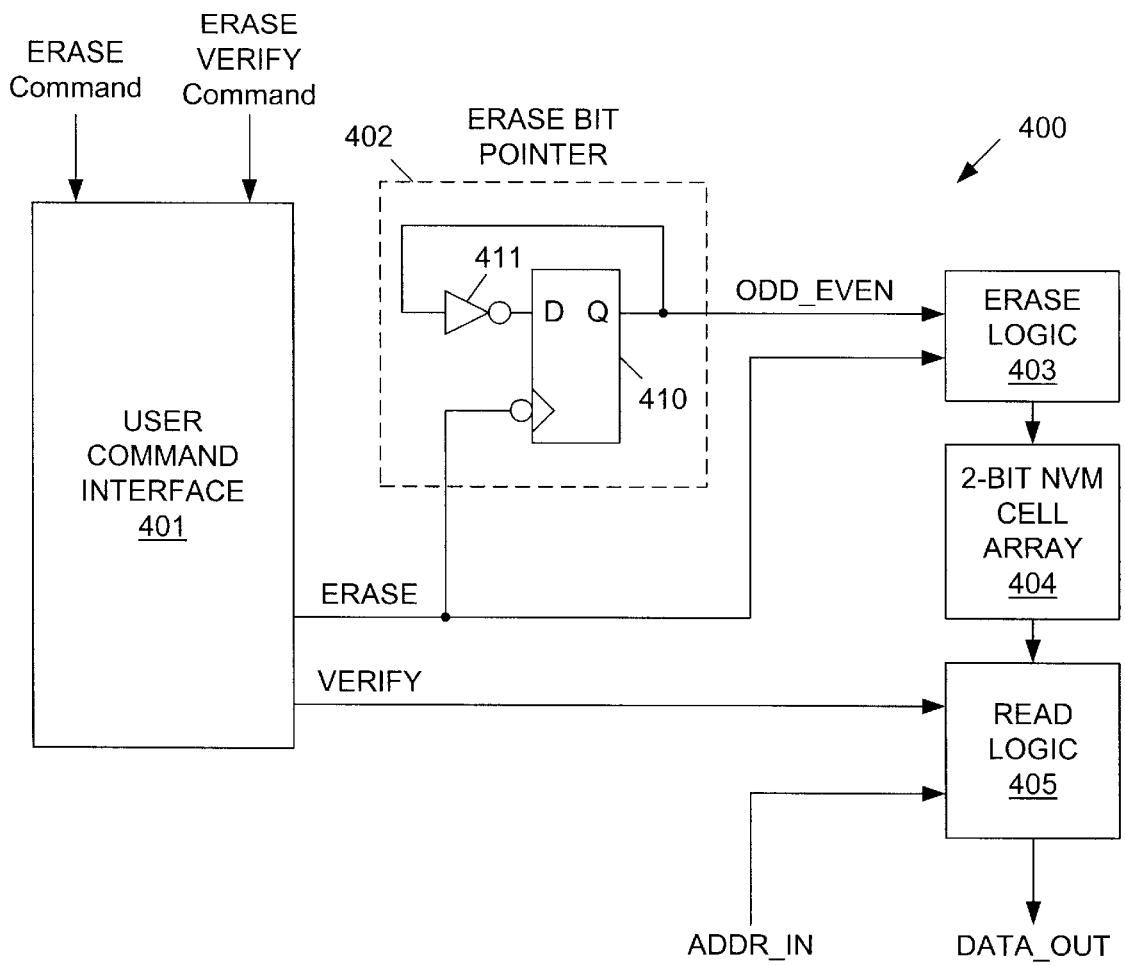
FIG. 4 is a block diagram of a 2-bit non-volatile memory system in accordance with one embodiment of the present invention.

FIG. 4 is a block diagram of a 2-bit non-volatile memory system 400 in accordance with one embodiment of the present invention. Memory system 400 includes user command interface 401, erase bit pointer 402, erase logic 403, 2-bit non-volatile memory cell array 404 and read logic 405. Non-volatile memory array 404 includes an array of 2-bit non-volatile memory cells, which are arranged in the manner illustrated in FIG. 2 or FIG. 3. Thus, array 404 includes a plurality of even bit lines and a plurality of odd bit lines. Each of the 2-bit non-volatile memory cells in array 404 stores a pair of bits (i.e., a right bit and a left bit). In accordance with one embodiment, 2-bit non-volatile memory cells and corresponding access circuitry is described in U.S. Pat. No. 6,081,456, issued Jun. 27, 2000, which is hereby incorporated by reference in its entirety.

Figure 1:
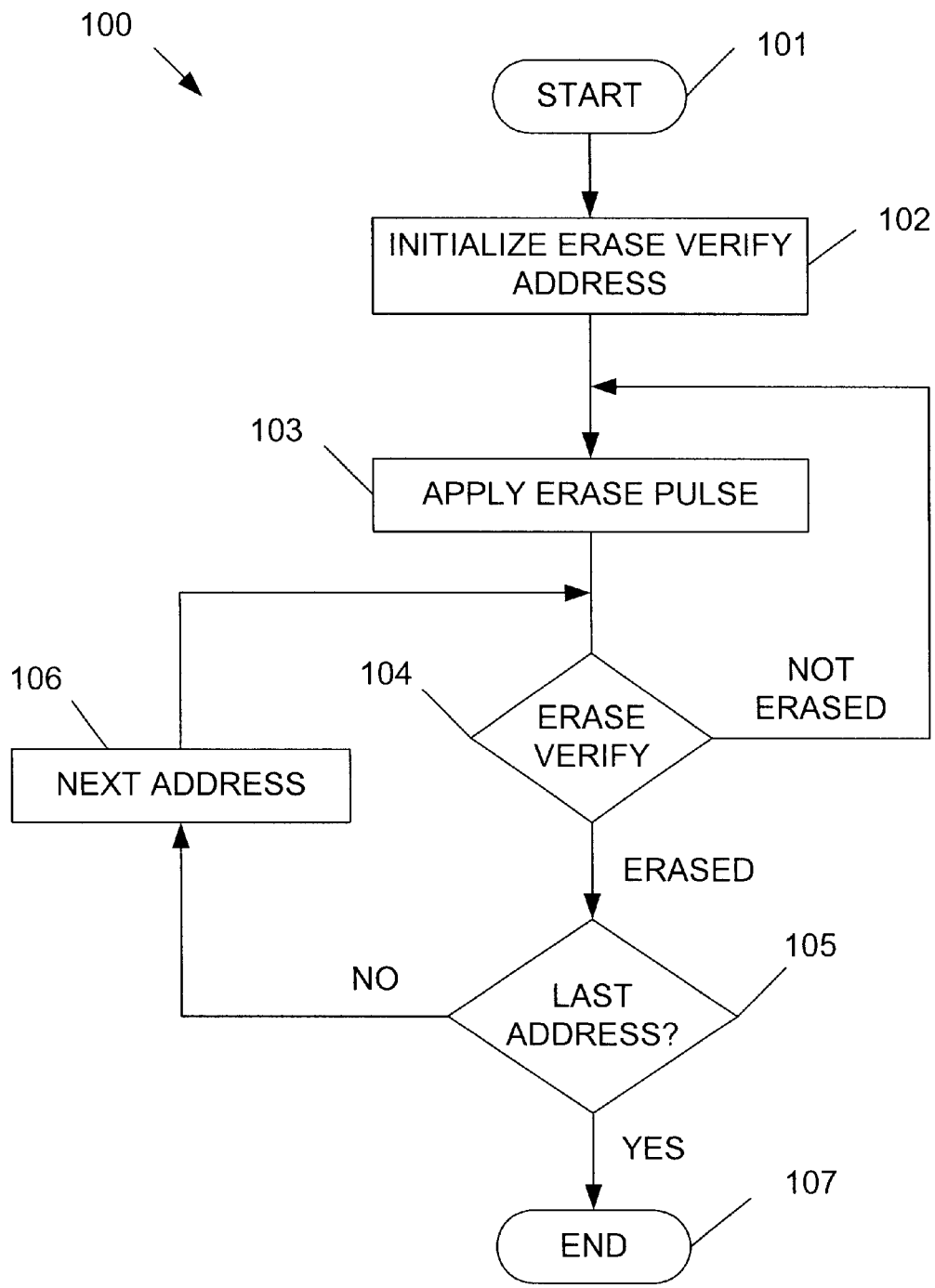
FIG. 1 is flow chart illustrating a conventional method for erasing a non-volatile memory system.

User command interface 401 operates in response to an ERASE command and an ERASE VERIFY command in a manner consistent with the conventional erase method illustrated by the flowchart of FIG. 1. Thus, an initial erase verify address is selected (Step 102). While this initial erase verify address can be any address in array 404, the initial erase verify address is selected to be the first address of array 404 (i.e., an address having all logic "0" bits) in the described examples.

To initiate an erase operation, the system user issues an ERASE command to user command interface 401. In response, user command interface 401 asserts the ERASE signal. The ERASE signal is provided to both erase bit pointer 402 and erase logic 403.

In the described embodiment, erase bit pointer 402 includes a D–Q flip-flop 410 and an inverter 411. The clock input terminal of flip-flop 410 is coupled to receive the inverted ERASE signal, such that flip-flop 410 is triggered by the falling edge of the ERASE signal. The Q output terminal of flip-flop 410 provides an ODD_EVEN control signal to erase logic 403. The Q output terminal of flip-flop 410 is coupled to the D input terminal of flip-flop 410 through inverter 411. Inverter 411 thereby provides the inverse of the ODD_EVEN signal to the D input terminal of flip-flop 410. As a result, the state of the ODD_EVEN signal toggles on each falling edge of the ERASE signal. Flip-flop 410 is reset during power on reset of the system, such that flip-flop 410 initially provides a logic "0" ODD_EVEN signal to erase logic 403.

Figure 5:
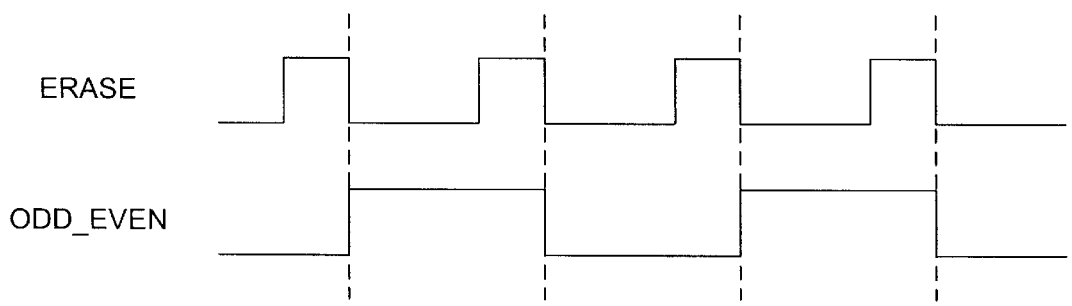
FIG. 5 is a waveform diagram illustrating the manner in which an erase bit pointer generates an ODD_EVEN control signal in response to an ERASE pulse in accordance with one embodiment of the present invention.

FIG. 5 is a waveform diagram illustrating the manner in which erase bit pointer 402 generates the ODD_EVEN signal in response to the ERASE signal.

The ODD_EVEN signal determines whether an ERASE pulse is applied to the even bit lines or the odd bit lines in non-volatile memory array 404. For example, if the ODD_EVEN signal has a logic "0" value when the ERASE signal is asserted, then erase logic 403 will apply an ERASE pulse to all of the odd bit lines in non-volatile memory array 404 (Step 103). Conversely, if the ODD_EVEN signal has a logic "1" value when the ERASE signal is asserted, then erase logic 403 will apply an ERASE pulse to all of the even bit lines in non-volatile memory array 404 (Step 103).

Thus, in response to an initial ERASE command, user command interface 401 asserts a first ERASE signal. In response to the asserted ERASE signal and the logic "0" ODD_EVEN control signal, erase logic 403 applies a first ERASE pulse to the odd bit lines of non-volatile memory array 404. Under these conditions, an erase operation is performed on all of the bits coupled to the odd bit lines within non-volatile memory array 404.

At the falling edge of the ERASE signal, the logic "1" value provided by inverter 411 is latched into flip-flop 410, thereby causing the ODD_EVEN signal to transition to a logic "1" value.

After the ERASE pulse has timed out, the system user asserts an ERASE VERIFY command, thereby causing an erase verify step to be performed (Step 104). User command interface 401 initiates the erase verify step by asserting the VERIFY signal, which is provided to read logic 405. At this time, the system user also provides the initial erase verify address to read logic 405 as the ADDR_IN signal. In response to the asserted VERIFY signal, read logic 405 performs a special erase verify read of the data location specified by the ADDR_IN signal (i.e., the initial erase verify address). The result of the read operation is sent to the system user as the DATA_OUT value. The system user reads the DATA_OUT value to determine the result of the erase operation (Step 104).

If all of the bits of the DATA_OUT value appear to be erased, the system user determines whether the applied ADDR_IN signal corresponds with the last address of the erase operation (Step 105). Because the ADDR_IN signal does not correspond with the last address at this time, the system user increments the applied ADDR_IN signal (Step 106). The system user then asserts the ERASE VERIFY command, and another erase verify operation is performed for the new ADDR_IN signal (Step 104).

Because only half of the bits in array 404 were subject to an erase condition during the first erase operation, it is not likely that the erase verify process will proceed very far after the first erase operation. When the system user determines that the DATA_OUT value contains bits that have not been erased (Step 104), the system user asserts a second ERASE command.

In response to the second ERASE command, user command interface 401 asserts a second ERASE signal. In response to the asserted ERASE signal and the logic "1" ODD_EVEN control signal, erase logic 403 applies a second ERASE pulse to the even bit lines of non-volatile memory array 404. Under these conditions, an erase operation is performed on all of the bits coupled to the even bit lines within non-volatile memory array 404.

At the falling edge of the ERASE signal, the logic "0" value provided by inverter 411 is latched into flip-flop 410, thereby causing the ODD_EVEN signal to transition to a logic "0" value.

After the second ERASE pulse has timed out, the system user asserts the ERASE VERIFY command, and provides an ADDR_IN signal that corresponds with the last address providing a failing erase verify result. As a result, another erase verify operation is performed (Step 104) at the last failing address in array 404.

Because both even and odd bit lines of memory array 404 have been subjected to one erase operation, it is possible for the entire array to be erased at this time. If this is the case, erase verify processing will proceed through the entire address space of non-volatile memory array 404, with each erase verify operation confirming that another address in non-volatile memory array 404 has been successfully erased. If this occurs, a valid erase verify operation will eventually be confirmed for the last address of array 404, thereby indicating that the entire array 404 has been successfully erased (Step 107).

If the entire non-volatile memory array 404 has not been successfully erased by the second ERASE pulse, then an erase verify operation will fail before reaching the last address, and processing will continue in the manner described above. More specifically, a third ERASE pulse will be applied to the odd bit lines of memory array 404 and another set of one or more erase verify operations will be performed, beginning at the last failing address. If one of these erase verify operation fails before reaching the last address, then a fourth ERASE pulse will be applied to the even bit lines of array 404, and yet another set of erase verify operations will be performed, beginning at the last failing address. This sequence continues until all of the bits in array 404 are successfully erased. In this manner, the system user can advantageously use the conventional method of FIG. 1 to erase 2-bit non-volatile memory cell array 404.

In a variation of the above-described embodiment, erase bit pointer 402 can be toggled at the rising edge of the ERASE signal.

Figure 6:
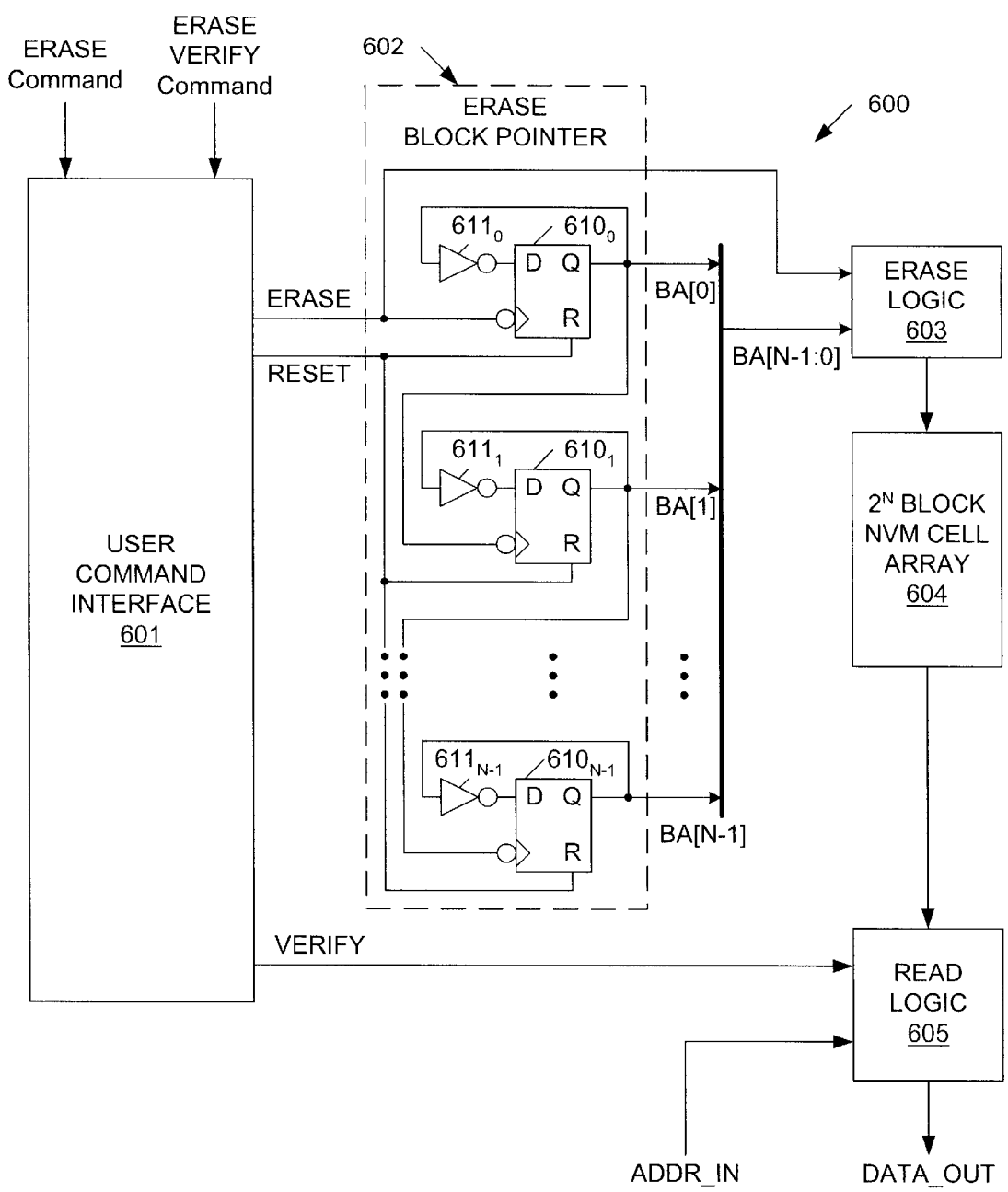
FIG. 6 is a schematic drawing of a multi-block non-volatile memory system in accordance with another embodiment of the present invention.

FIG. 6 is a schematic drawing of a multi-block non-volatile memory system 600 in accordance with another embodiment of the present invention. Memory system 600 includes user command interface 601, erase block pointer 602, erase logic 603, multi-block non-volatile memory array 604 and read logic 605. Memory array 604 includes $2^N$ blocks (not shown) of 1-bit non-volatile memory cells, which must be individually and separately erased. These blocks are designated as Block[0] to Block[$2^{N-1}$]. Erase logic 603 enables an erase pulse to be applied to one of these blocks at any given time.

Erase block pointer 602 includes N flip-flops $610_0$–$610_{N-1}$ and N corresponding inverters $611_0$–$611_{N-1}$. The Q output terminal of each of flip-flops $610_0$–$610_{N-1}$ is coupled to its D input terminal through a corresponding one of inverters $611_0$–$611_{N-1}$. The reset input terminal of each of flip-flops $610_0$–$610_{N-1}$ is coupled to receive a RESET signal from user command interface 601. The ERASE pulse is applied to the inverse clock input terminal of flip-flop $610_0$ and to erase logic 603. The Q output terminal of each flip-flop is coupled to the inverse clock terminal of the adjacent flip-flop (except for the Q output terminal of flip flop $610_{N-1}$). For example, the Q output terminal of flip-flop $610_0$ is coupled to the inverse clock terminal of flip-flop $610_1$. Each of flip-flops $610_0$–$610_{N-1}$ provides a corresponding block address signal BA[0]–BA[N−1] to erase logic 603.

User command interface 601 operates in response to an ERASE command and an ERASE VERIFY command in a manner consistent with the conventional erase method illustrated by the flowchart of FIG. 1. Thus, an initial erase verify address is selected (Step 102). While this initial erase verify address can be any address in array 604, the initial erase verify address is selected to be the first address of the first block (i.e., Block[0]) of array 604 (i.e., an address having all logic "0" bits) in the described examples.

To initiate an erase operation, the system user issues an ERASE command to user command interface 601. In response, user command interface 601 asserts the RESET signal. The asserted RESET signal resets each of flip-flops $610_0$–$610_{N-1}$, such that the block address signals BA[N−1:0] have logic "0" values. These block address signals are provided to erase logic 603. The block address signals BA[N−1:0] determine which one of the N memory blocks in array 604 receives an ERASE pulse. Because the block address signals BA[N−1:01] exhibit a binary count of "0", Block[0] of array 604 is the first block to receive an ERASE pulse.

Also in response to the ERASE command, user command interface 601 asserts a first ERASE signal. In response to the asserted ERASE signal and the zero count of block address signals BA[N−1:0], erase logic 603 applies a first ERASE pulse to Block[0] in array 604. Thus, an erase operation is performed on all of the bits in Block[0] of memory array 604.

At the falling edge of the ERASE signal, the logic "1" value provided by inverter $611_0$ is latched into flip-flop $610_0$, thereby causing the BA[0] signal to transition to a logic "1" value. At this time, the BA[N−1:1] signals retain the previously stored logic "0" values. Thus, the BA[N−1:0] signals exhibit a binary count of "1" at this time.

After the ERASE pulse has timed out, the system user asserts an ERASE VERIFY command, thereby causing an erase verify step to be performed (Step 104). User command interface 601 initiates the erase verify step by asserting the VERIFY signal, which is provided to read logic 605. At this time, the system user also provides the initial erase verify address to read logic 605 as the ADDR_IN signal. In response to the asserted VERIFY signal, read logic 605 performs a special erase verify read of the data location specified by the ADDR_IN signal (i.e., the initial erase verify address). The result of the read operation is sent to the system user as the DATA_OUT value. The system user reads the DATA_OUT value to determine the result of the erase operation (Step 104).

If all of the bits of the DATA_OUT value appear to be erased, the system user determines whether the applied ADDR_IN signal corresponds with the last address of the erase operation (Step 105). Because the ADDR_IN signal does not correspond with the last address at this time, the system user increments the applied ADDR_IN signal (Step 106), and repeats the erase verify process for the new ADDR_IN signal (Step 104).

Because all of the bits in Block[0] of array 604 were subject to an erase condition during the first erase operation, it is possible that the erase verify process may continue until the erase of the entire Block[0] has been verified. In this case, the erase verify process continues into the address space of Block[1]. Because Block[1] has not yet been subject to an erase condition, it is likely that the erase verify process will fail in the address space of Block [1]. It is also possible that the erase verify process fails in the address space of Block[0]. When the system user determines that a DATA_OUT value contains bits that have not been erased (Step 104), the system user stores the address corresponding with the failed erase verify process, and asserts a second ERASE command.

In response to the second ERASE command, user command interface 601 asserts a second ERASE signal. In response to the asserted ERASE signal and the binary "1" count provided by the BA[N−1:0] block address signals, erase logic 603 applies a second ERASE pulse to the bit lines of Block[1] of array 604. Under these conditions, an erase operation is performed on all of the bits in Block[1] of array 604.

At the falling edge of the ERASE signal, the logic "0" value provided by inverter $611_0$ is latched into flip-flop $610_0$, thereby causing the BA[0] signal to transition from a logic "1" value to a logic "0" value. The falling edge of the BA[0] signal clocks flip-flop $610_1$, such that the logic "1" value provided by inverter $611_1$ is latched into flip-flop $610_2$, thereby causing the BA[2] signal to transition to a logic "1" value. At this time, the BA[N−1:0] signals provide a binary count of "2".

After the second ERASE pulse has timed out, the system user asserts the ERASE VERIFY command, and provides an ADDR_IN signal that corresponds with the address that caused the previous erase verify operation to fail. As a result, another erase verify operation is performed (Step 104), beginning at the last failing address in array 604. Processing continues in the above-described manner until all of the $2^N$ blocks in memory array 604 have been subjected to an ERASE pulse. Flip-flops $610_0$–$610_{N-1}$ operate as an N-bit counter that is incremented from an initial binary count of 0 to a maximum binary count of $2^{N-1}$. If the erase verify operation fails after $2^N$ ERASE pulses have been asserted, then the N-bit counter automatically rolls over to the initial zero count, wherein that each of flip-flops $610_0$–$610_{N-1}$ provides a logic "0" value. Processing then continues as described above, until the erase verify operation is successfully completed.

Figure 7:
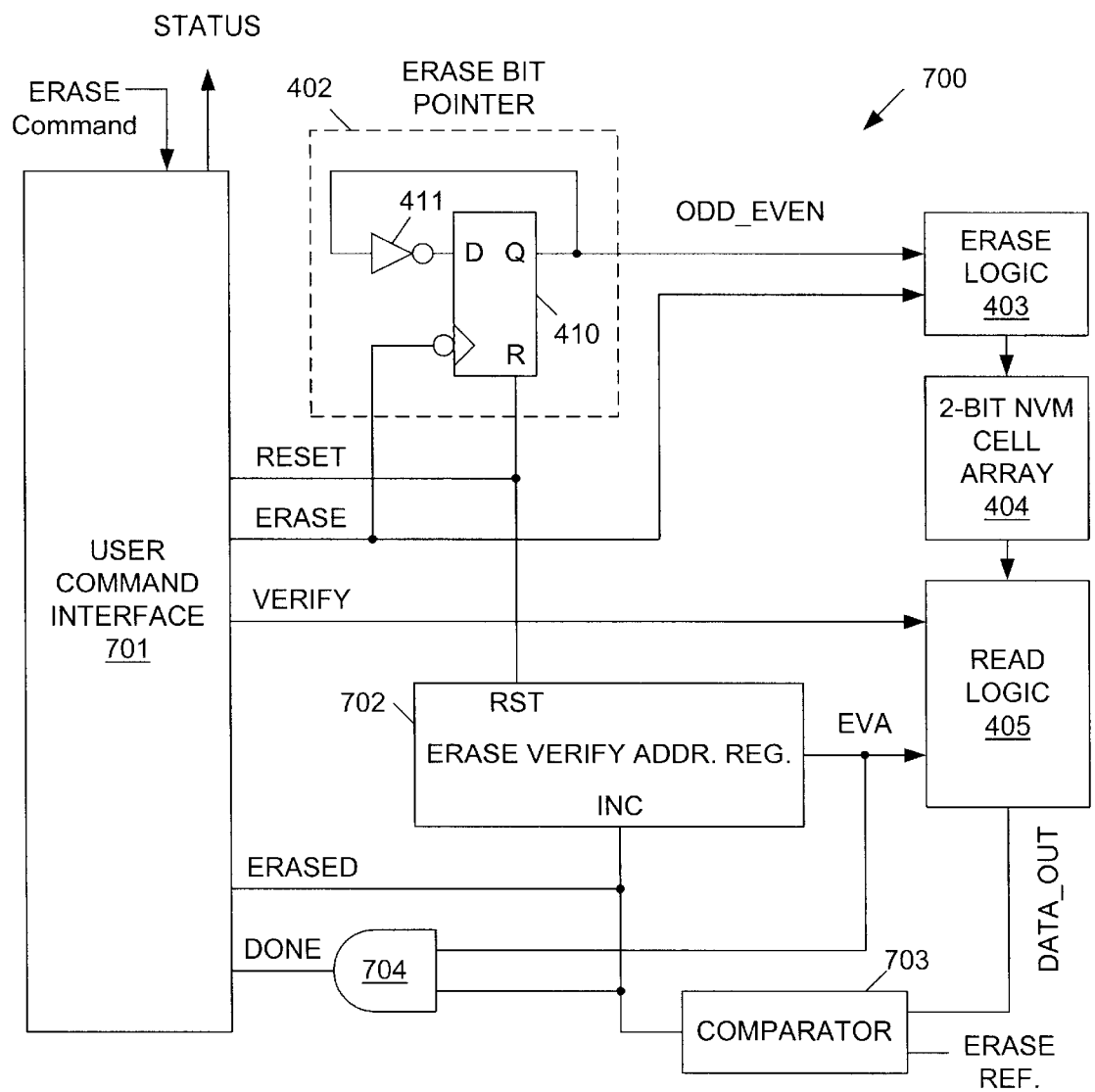
FIG. 7 is a block diagram of a 2-bit non-volatile memory system in accordance with another embodiment of the present invention.

FIG. 7 is a block diagram of a 2-bit non-volatile memory system 700 in accordance with another embodiment of the present invention. Memory system 700 includes erase bit pointer 402, erase logic 403, 2-bit non-volatile memory cell array 404 and read logic 405, which are described above in connection with memory system 400 (FIG. 4). In addition, memory system 700 includes user command interface 701, erase verify address register 702, comparator 703 and AND gate 704.

User command interface 701 generates a RESET signal, an ERASE signal and a VERIFY signal in a manner consistent with the conventional erase method illustrated by the flowchart of FIG. 1. Thus, to initiate an erase operation, the system user issues an ERASE command to user command interface 701. In response, user command interface 701 asserts the RESET signal and the ERASE signal. (Note that user command interface 701 also asserts the RESET signal on power-up of memory system 700.) The RESET signal is provided to the reset terminal of flip-flop 410, and to the reset input terminal (RST) of erase verify address register 702. The ERASE signal is provided to both erase bit pointer 402 and erase logic 403.

Erase bit pointer 402 generates an ODD_EVEN signal in response to the ERASE signal in the manner described above in connection with the description of FIG. 4. Again, the ODD_EVEN signal is used to determine whether the ERASE pulse is applied to the right or left bit lines in non-volatile memory array 404. An erase operation is performed according to the method presented in FIG. 1. In response to an ERASE command provided by the system user (Step 101), user command interface 701 asserts the RESET signal, thereby resetting flip-flop 410. At this time, the Q output terminal of flip-flop 210 provides a logic "0" ODD_EVEN signal to erase logic 403. The asserted RESET signal also resets erase verify address register 702 to a first erase verify address (Step 102). In the described embodiment, the first erase verify address has all logic "0" values, and the last erase verify address has all logic "1" values.

Also in response to the ERASE command, user command interface 701 asserts a first ERASE signal, thereby causing erase logic 403 to provide a first ERASE pulse to the odd bit lines of non-volatile memory array 404 in response to the logic "0" ODD _EVEN signal. Under these conditions, an erase operation is performed on all of the odd bit lines within non-volatile memory array 404.

At the falling edge of the ERASE signal, the logic "1" value provided by inverter 411 is latched into flip flop 410, thereby causing the ODD_EVEN signal to transition to a logic "1" value.

After the ERASE pulse has been applied to array 404, user command interface 701 asserts a VERIFY signal, thereby causing an erase verify step to be performed (Step 104). The VERIFY signal is provided to read logic 405. When the VERIFY signal is asserted, read logic 405 causes a data value to be read from non-volatile memory array 404 at the address identified by the erase verify address (EVA) stored in erase verify address register 702. The first time that the VERIFY signal is asserted, the erase verify address EVA corresponds with the first address of non-volatile memory array 404.

The data value read from non-volatile memory array 404 is routed to an input terminal of comparator 703. The other input terminal of comparator 703 is coupled to receive a reference data value having the same state as an erased non-volatile memory cell in array 404. If comparator 703 determines that the data value read from memory array 404 has the same logic level as the reference data value, then comparator 703 asserts a logic high ERASED control signal, thereby indicating that the data value at erase verify address EVA has been successfully erased. A logic high ERASED control signal increments the erase verify address EVA stored in verify address register 702 (Step 106). The logic high ERASED control signal is also provided to user command interface 701. If the erase verify address EVA does not correspond with the last address of non-volatile memory array 404, user command interface 701 will re-assert the VERIFY signal, thereby initiating another erase verify operation.

Logical AND gate 704 is used to implement Step 105 of the erase operation. Thus, AND gate 704 determines when the ERASED control signal is asserted high and the erase verify address EVA corresponds with the last address of non-volatile memory array 404 (i.e., the erase verify address EVA has all logic high values). Under these conditions, AND gate 704 will assert a logic high DONE control signal, thereby indicating to user command interface 701 that the erase operation is complete (Step 107).

Because the erase verify address EVA does not yet correspond with the last address of non-volatile memory array 404, another erase verify operation is performed (Step 104). Because the erase verify address EVA has been incremented to correspond with the second address of non-volatile memory array 404, a second data value is read from the second address of non-volatile memory array 404. This erase verify operation will likely fail because only half of array 404 was subject to an erase condition in response to the first ERASE signal. Thus, the state of the second data value will likely not match the state of an erased memory cell. In this case, comparator 703 will provide a logic low ERASED control signal. This logic low ERASED control signal fails to increment the erase verify address EVA stored in register 702. This logic low ERASED control signal also causes user command interface 701 to assert a second ERASE signal (Step 103).

As described above, the ODD_EVEN signal was toggled to a logic "1" value at the falling edge of the first ERASE signal. In response to the logic "1" ODD_EVEN signal, erase logic 403 applies the second ERASE pulse to all of the even bit lines in non-volatile memory array 404. As a result, the remaining half of the bits in non-volatile memory array 404 are subject to erase conditions. At the falling edge of the second ERASE signal, the logic "0" value provided by inverter 411 is latched into flip flop 410, thereby causing the ODD_EVEN signal to transition to a logic "0" value.

After the second ERASE pulse has been applied to the even bit lines of non-volatile memory array 404, user command interface 701 again asserts the VERIFY signal, thereby initiating another erase verify operation (Step 104). At this time, the erase verify address (EVA) stored in erase verify address register 702 corresponds with the second address of non-volatile memory array 404 (i.e., the address on which the last erase verify step failed). As a result, read logic 405 causes the data value at the second address of non-volatile memory array 404 to be read and provided to comparator 703. If comparator 703 detects a match, then the data value at the second address has been successfully erased. In this case, comparator 703 asserts a logic high ERASED control signal, which increments the erase verify address EVA stored in erase verify address register 702 (Step 106). At this time, the erase verify address EVA does not correspond with the last address of array 404 (i.e., erase verify address EVA does not have all logic high values). (Step 105.) Consequently, AND gate 704 provides a logic low DONE signal to user command interface 701. In response, user command interface 701 allows the erase operation to continue.

User command interface 701 initiates another erase verify operation in response to the logic high ERASED control signal and the logic low DONE signal (Step 104). Because the erase verify address EVA has been incremented, a data value is read from the third address of array 404. Because both even and odd bit lines of memory array 404 have been subjected to one erase operation, it is possible for the entire array to be erased at this time. If this is the case, erase verify processing will proceed through the entire address space of non-volatile memory array 404, with each erase verify operation confirming that another address in non-volatile memory array 404 has been successfully erased. When the erase verify address EVA is equal to the last address and the ERASED control signal has a logic high value, AND gate 704 will provide a logic high DONE signal, thereby indicating that the entire non-volatile memory array 404 has been successfully erased (Step 107).

If the entire non-volatile memory array 404 has not been successfully erased by the second ERASE pulse, then the erase verify operation will fail, and processing will continue in the manner described above. More specifically, a third ERASE pulse will be applied to the odd bit lines of memory array 404 and an erase verify operation will be performed. If this erase verify operation fails, then a fourth ERASE pulse will be applied to the even bit lines of non-volatile memory array 404, and another erase verify operation will be performed. This sequence continues until all of the bits in array 404 are successfully erased. In this manner, the conventional method of FIG. 1 can advantageously be used to erase 2-bit non-volatile memory cell array 404. When user command interface 701 determines that all of the bits in array 404 have been erased, user command interface 701 asserts a STATUS signal. The STATUS signal indicates to the system user that the erase verify operation has been completed.

Figure 8:
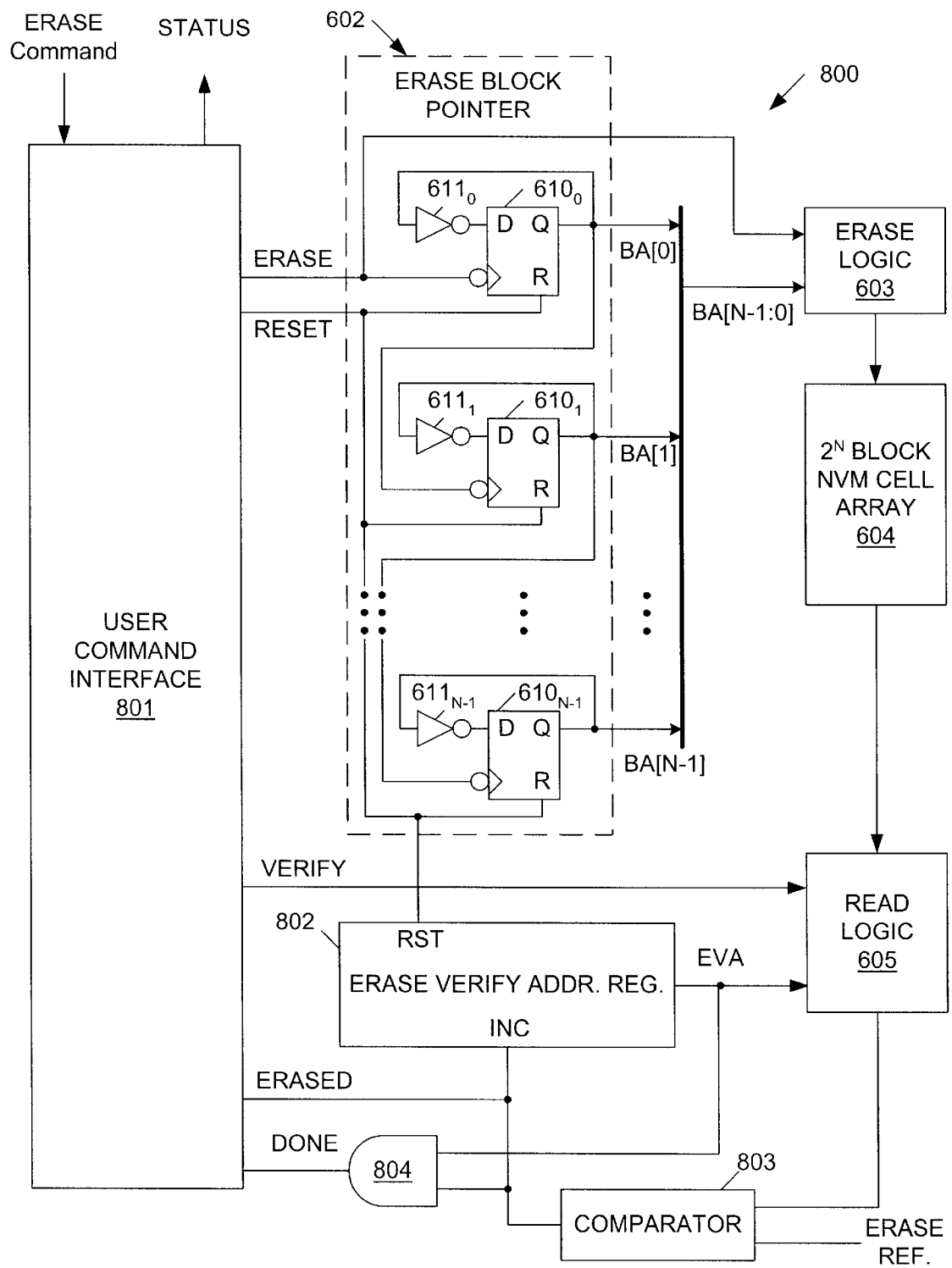
FIG. 8 is a schematic drawing of a multi-block non-volatile memory system in accordance with another embodiment of the present invention.

FIG. 8 is a schematic drawing of a multi-block non-volatile memory system 800 in accordance with another embodiment of the present invention. Because memory system 800 is similar to memory system 600 (FIG. 6), similar elements in FIGS. 6 and 8 are labeled with similar reference numbers. Thus, memory system 800 includes erase block pointer 602, erase logic 603, multi-block non-volatile memory array 604 and read logic 605. Memory system 800 also includes user command interface 801, erase verify address register 802, comparator 803 and AND gate 804.

Upon power up or receiving an ERASE command from the system user, user command interface 801 asserts the RESET signal and the ERASE signal. The RESET signal resets each of flip-flops $610_0$–$610_{N-1}$, as well as erase verify address register 802. When erase logic 603 receives the first ERASE pulse, all of the block address signals BA[N−1:0] have logic "0" values. In response, erase logic 603 applies the ERASE pulse to Block[0] in memory array 604.

After the ERASE pulse has timed out, user command interface 801 asserts the VERIFY signal, thereby initiating an erase verify operation, which is carried out in the manner described above. Even if the first ERASE pulse is sufficient to erase all of the cells in Block[0], the erase verify operation will fail in Block[1], because an erase operation has not yet been performed in this block.

At the falling edge of the first ERASE pulse, flip-flop $610_0$ is set to provide a logic "1" value at its Q output terminal. That is, the block address signal BA[0] transitions to a logic "1" value.

Upon detecting that the erase verify operation has failed, user command interface 801 asserts a second ERASE pulse. At this time, the block address signal BA[0] has a logic "1" value, and all of the other block address signals BA[N−1:1] have logic "0" values. In response, erase logic 603 applies the ERASE pulse to Block[1] in memory array 604. An erase verify operation is then performed in the manner described above. Even if the second ERASE pulse was sufficient to erase all of the cells in Block[1], the erase verify operation will likely fail in Block[2], because an erase operation has not yet been performed in this block.

At the falling edge of the second ERASE signal, a logic "0" value is latched into flip flop $610_0$ and a logic "1" value is latched into flip flop $610_1$. As described above, erase block pointer 602 is configured as an N-bit binary counter that is incremented on each falling edge of the ERASE signal.

Upon detecting that the second erase verify operation has failed, user command interface 801 asserts a third ERASE signal. At this time, the block address signals BA[0] and BA[1] have logic "1" values, and all of the other block address signals BA[N−1:2] have logic "0" values. In response, erase logic 603 applies the ERASE pulse to Block[2] in memory array 604. An erase verify operation is then performed in the manner described above. Even if the third ERASE pulse was sufficient to erase all of the cells in Block[2], the erase verify operation will likely fail in the next block, because an erase operation has not yet been performed in this block.

Processing continues in the above-described manner until all of the $2^N$ blocks in memory array 604 have been subjected to an ERASE pulse. As indicated above, flip flops $610_0$–$610_{N-1}$ operate as an N-bit counter that counts from 0 to N−1, and then wraps around to 0. Thus, if the erase verify operation still fails after $2^N$ erase verify operations, then the process is automatically repeated, with an ERASE pulse being applied to Block[0]. Processing then continues as described above, until the erase verify operation is successfully completed. At this time, user command interface 801 asserts a STATUS signal, which informs the system user that the erase verify operation has been completed.

The various embodiments of the structures and methods of this invention that are described above are illustrative only of the principles of this invention and are not intended to limit the scope of the invention to the particular embodiments described. Thus, the invention is limited only by the following claims.

What is claimed is:

1. A non-volatile memory system comprising:
   an array of 2-bit non-volatile memory cells, including a first set of bit lines and a second set of bit lines;
   an erase bit pointer coupled to receive an erase signal, the erase bit pointer being configured to generate a control signal that toggles between a first state and a second state in response to the erase signal; and
   erase logic coupled to receive the erase signal and the control signal, the erase logic being configured to apply an erase pulse to the first set of bit lines when the control signal has the first state and the erase signal is asserted, and to apply an erase pulse to the second set of bit lines when the control signal has the second state and the erase signal is asserted.

2. The non-volatile memory system of claim 1, further comprising a user command interface coupled to the erase bit pointer and the erase logic, wherein the user command interface generates the erase signal in response to an erase command.

3. The non-volatile memory system of claim 2, further comprising read logic coupled to the user command interface and the array, wherein the user command interface is configured to assert a verify control signal to the read logic after the erase pulse times out, and the read logic is configured to read a data value from the array in response to the verify control signal.

4. The non-volatile memory system of claim 3, further comprising an address register configured to store an erase verify address and provide the erase verify address to the read logic.

5. The non-volatile memory system of claim 4, further comprising a comparator coupled to receive the data value and a reference data value corresponding with an erased memory cell.

6. The non-volatile memory system of claim 5, wherein an output terminal of the comparator is coupled to an incrementing terminal of the address register.

7. The non-volatile memory system of claim 5, wherein the output terminal of the comparator is coupled to the user command interface.

8. The non-volatile memory system of claim 1, wherein the erase bit pointer comprises:

a flip flop having an input terminal and an output terminal, wherein the control signal is provided by the output terminal of the flip flop; and an inverter coupled between the input terminal and the output terminal of the flip-flop.

9. The non-volatile memory system of claim 8, wherein the flip flop further comprises a clock terminal coupled to receive the erase signal.

10. The non-volatile memory system of claim 9, wherein the flip flop further comprises a reset terminal coupled to receive a reset signal from the user command interface.

11. The non-volatile memory system of claim 1, wherein the erase bit pointer is configured to toggle the state of the control signal in response to an edge of the erase signal.

12. A non-volatile memory system comprising:

an array non-volatile memory cells arranged in a plurality of blocks;

an erase block pointer coupled to receive an erase signal, the erase block pointer being configured to generate an erase block address that is incremented in response to an edge of the erase signal; and erase logic coupled to receive the erase signal and the erase block address, the erase logic being configured to apply an erase pulse to a block identified to by the erase block address when the erase signal is asserted.

13. The non-volatile memory system of claim 12, further comprising a user command interface coupled to the erase block pointer and the erase logic, wherein the user command interface generates the erase signal in response to an erase command.

14. The non-volatile memory system of claim 13, further comprising read logic coupled to the user command interface and the array, wherein the user command interface is configured to assert a verify control signal to the read logic after the erase pulse times out, and the read logic is configured to read a data value from the array in response to the verify control signal.

15. The non-volatile memory system of claim 14, further comprising an address register configured to store an erase verify address and provide the erase verify address to the read logic.

16. The non-volatile memory system of claim 15, further comprising a comparator coupled to receive the data value and a reference data value corresponding with an erased memory cell.

17. The non-volatile memory system of claim 16, wherein an output terminal of the comparator is coupled to an incrementing terminal of the address register.

18. The non-volatile memory system of claim 16, wherein the output terminal of the comparator is coupled to the user command interface.

19. The non-volatile memory system of claim 12, wherein the erase block pointer comprises a binary counter that is incremented in response to the erase signal.

20. The non-volatile memory system of claim 12, wherein the erase block pointer is configured to increment the memory block address in response to the falling edge of the erase signal.

21. A method of erasing a non-volatile memory system comprising an array of 2-bit non-volatile memory cells, including a first set of bit lines and a second set of bit lines, the method comprising the steps of:

applying a first erase pulse to the first set of bit lines; then performing an erase verify operation until the erase verify operation fails; then applying an second erase pulse to the second set of bit lines; and then continuing the erase verify operation until the erase verify operation fails or the erase verify operation is successfully completed.

22. A method of erasing a non-volatile memory system comprised a plurality of non-volatile memory blocks, the method comprising the steps of:

applying a first erase pulse to only a first one of the non-volatile memory blocks; then performing an erase verify operation until the erase verify operation fails; then applying an second erase pulse to only a second one of the non-volatile memory blocks; and then continuing the erase verify operation until the erase verify operation fails or the erase verify operation is successfully completed.

\* \* \* \* \*